United States Patent

Kohler

[11] 4,240,036
[45] Dec. 16, 1980

[54] LINEARIZED THREE-STATE SWITCHING AMPLIFIER

[75] Inventor: Thomas P. Kohler, Baldwinsville, N.Y.

[73] Assignee: General Electric Company, Syracuse, N.Y.

[21] Appl. No.: 29,615

[22] Filed: Apr. 13, 1979

[51] Int. Cl.³ .............................................. H03F 3/38
[52] U.S. Cl. .............................. 330/10; 330/207 A; 330/251
[58] Field of Search ...................... 330/10, 207 A, 251

[56] References Cited

U.S. PATENT DOCUMENTS

| 3,449,689 | 6/1969 | Harley | 330/51 |
|---|---|---|---|
| 3,585,517 | 6/1971 | Herbert | 330/10 |
| 3,899,745 | 8/1975 | Fletcher et al. | 330/207 A |
| 3,999,143 | 12/1976 | Yoshida et al. | 330/207 A |
| 4,016,501 | 4/1977 | Jasinski et al. | 330/10 |

Primary Examiner—James B. Mullins
Attorney, Agent, or Firm—Robert J. Kraus; Carl W. Baker; Richard V. Lang

[57] ABSTRACT

A pulse width modulated switching amplifier is provided for amplifying an analog signal. Means is provided for producing positive and negative signals representative of positive and negative excursions of the analog signal, respectively. The positive and negative signals are applied to level shifters which produce positive and negative replica signals having the same waveshapes as the positive and negative signals, respectively, but which vary about a predetermined reference level. The level shifted replica signals are then applied to first and second comparators, respectively, which continuously sum the instantaneous magnitude thereof with the instantaneous magnitude of a triangular modulation signal also varying about the reference level. Each comparator produces a logical ONE output signal when the sum is positive and a logical ZERO output signal when the sum is negative. A switching circuit receives the logical signals from the comparators and produces an output pulse of one polarity when both comparators are producing logical ONE signals, an output pulse of the opposite polarity when both comparators are producing logical ZERO signals, and no output when the comparators are producing unlike logical signals. The output pulses are applied to a demodulator which produces an amplified replica of the analog signal.

6 Claims, 5 Drawing Figures

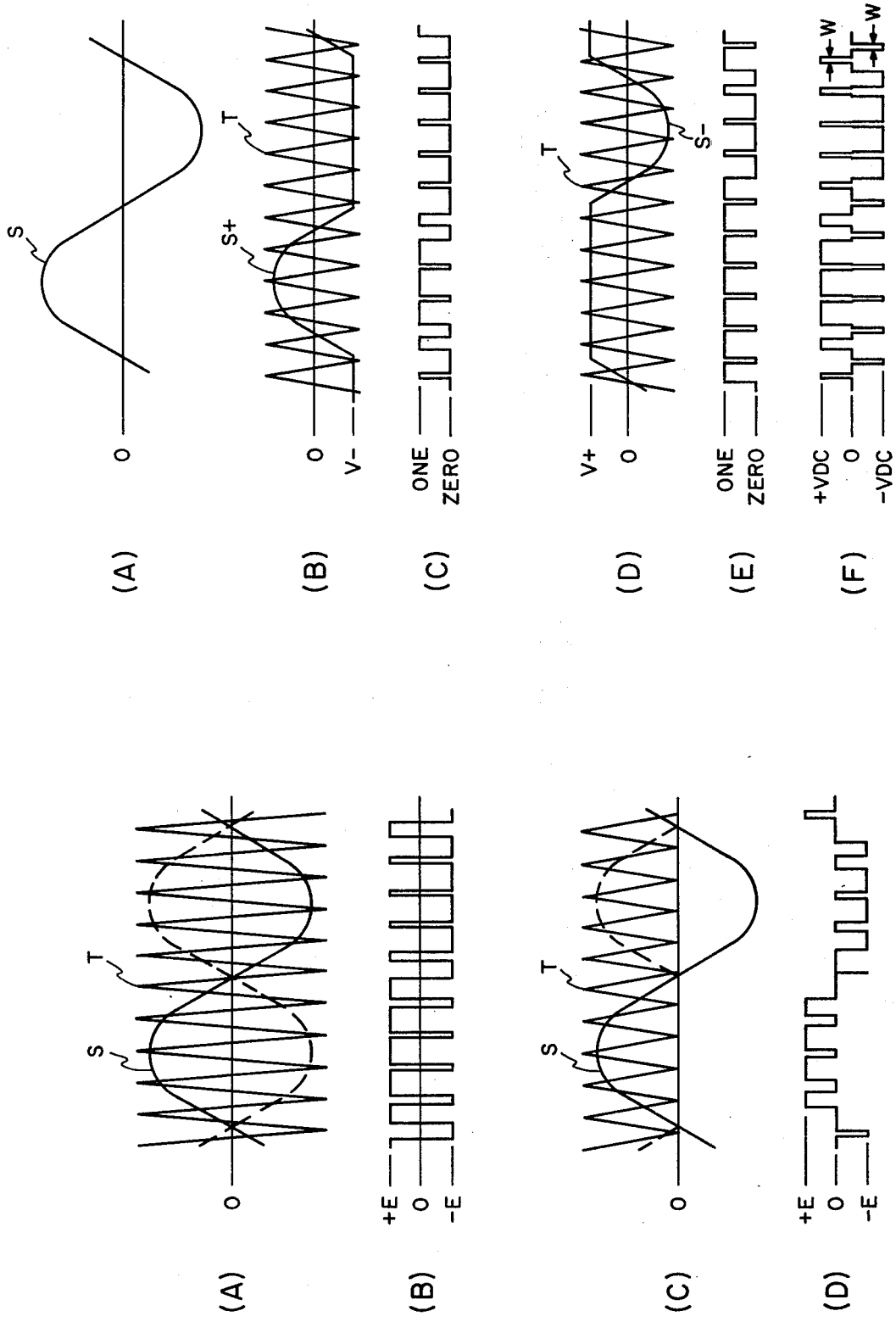

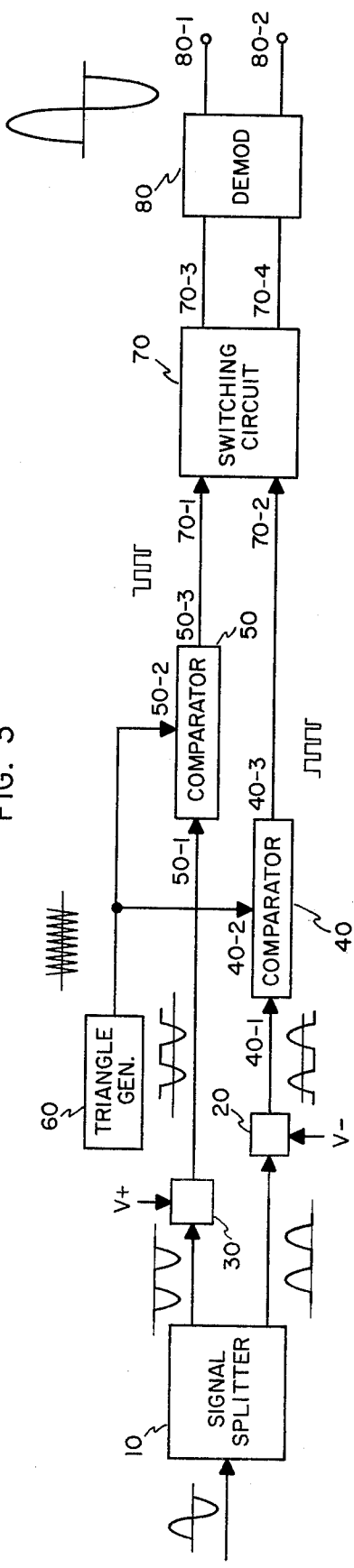
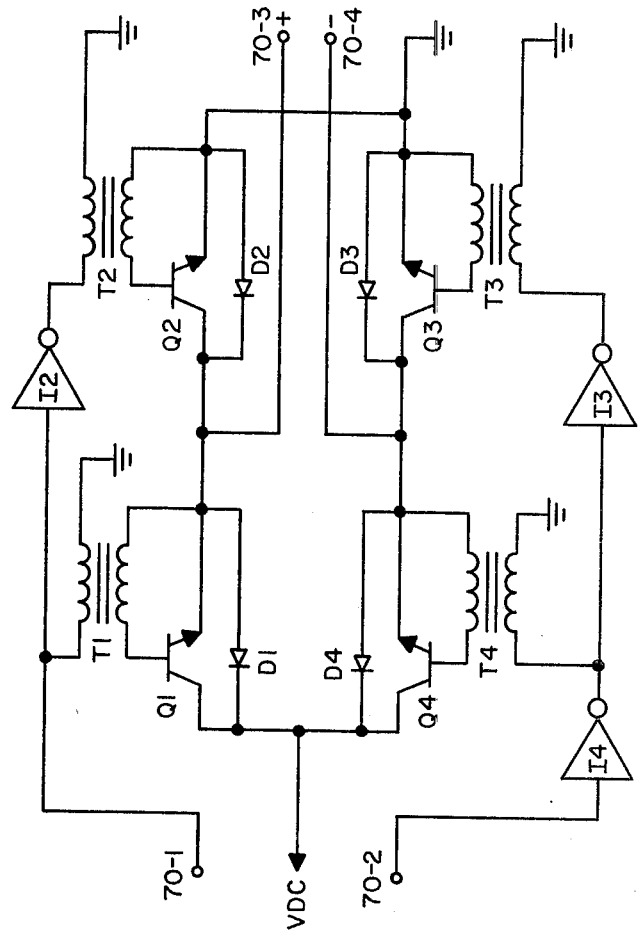
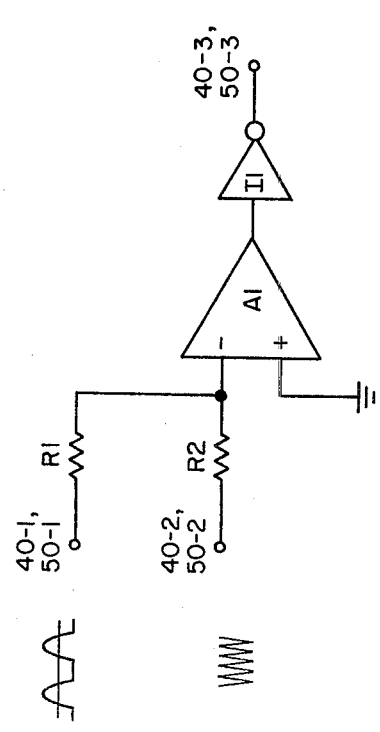
FIG. 3
FIG. 5
FIG. 4

LINEARIZED THREE-STATE SWITCHING AMPLIFIER

BACKGROUND OF THE INVENTION

1. Field of the Invention

The invention relates to pulse width modulated switching amplifiers for analog signals and in particular to means for maximizing the efficiency and linearity of such amplifiers.

2. Description of the Prior Art

Pulse width modulated switching amplifiers are used for high power amplification of analog signals due to the high efficiency realizable when low energy dissipation switching devices are used. Generally, these amplifiers operate at a switching frequency which is high with respect to the highest frequency of the input signals to be amplified, and employ either two-state or three-state switching circuits to produce a pulse width modulated waveform. This waveform is then demodulated, usually by a simple low-pass filter, to yield the desired amplified signal output.

A two-state switching amplifier typically produces a constant frequency output waveform which, before demodulation, cyclically alternates between fixed positive and negative magnitudes. The relative durations of the positive and negative pulses (forming the positive and negative portions of each cycle of this output waveform) vary in response to the instantaneous magnitude of the analog signal applied to the input of the amplifier. As the magnitude of the analog signal approaches the upper limit of the operating range of the amplifier, the output waveform remains at the polarity of the analog signal much longer than it remains at the opposite polarity during each cycle. As the instantaneous magnitude of the analog signal decreases to zero, the durations of the positive and negative pulses forming each cycle of the output waveform approach equality.

The two-state switching amplifier has the advantage of high linearity over its entire operating range, but suffers from the disadvantage that its output signal contains a spurious signal in the form of undesirably large spectral lines at the switching frequency. Also, its efficiency generally is somewhat lower than that of the three-state switching amplifier.

A conventional three-state switching amplifier also produces cyclically occurring pulses of fixed magnitude and usually of fixed periodicity, although in some cases the period may be made variable. A pulse is produced during eacy cycle, with the same polarity as the analog signal applied to the input of the amplifier. The duration of each pulse relative to the period of the cycle in which it occurs is determined by the instantaneous magnitude of the analog signal. As the magnitude of the analog signal approaches the upper limit of the operating range of the amplifier, it produces pulses of the same polarity as the analog signal and of a duration approaching the full period of one cycle. During the remainder of each cycle no output signal is produced. As the magnitude of the analog signal decreases to zero, the duration of the pulses decreases to zero.

The three-state switching amplifier has the advantage of a low spurious output relative to the desired signal, but suffers from the disadvantage of poor linearity at the lower end of the operating range. As the magnitude of analog signals applied to the input of the amplifier approaches zero, the durations of the pulses required to represent such signals approach the storage time of the amplifier switching transistors.

It is the primary object of the present invention to provide a pulse width modulated switching amplifier having the linear operating range of a two-state switching amplifier, and producing signals having the low spurious signal content characteristic of three-state switching amplifiers.

SUMMARY OF THE INVENTION

The object of the invention has been accomplished by providing a pulse width modulated switching amplifier which effects modulation of an applied analog signal by independently comparing positive and negative components of the analog signal with a switching signal. These positive and negative components are applied to level shifters which produce positive and negative replica signals having the same waveshapes as the positive and negative components, respectively, but which vary about a predetermined reference level. The level shifted signals are applied to first and second comparators, respectively, which continuously sum the instantaneous magnitudes of these signals with the instantaneous magnitude of the switching signal which varies symmetrically above and below the predetermined reference level. Each comparator produces a first control signal when the sum is positive and a second control signal when the sum is negative.

A switching circuit receives the control signals from the comparators and produces an output pulse of one polarity when both comparators are producing the first control signal, an output pulse of the opposite polarity when both comparators are producing the second control signal and no output when the comparators are producing unlike control signals. The output pulses are applied to a demodulator which produces an amplified replica of the analog signal. The bipolar pulses produced by the switching circuit have the advantageous characteristics of the pulses produced by both the conventional two-state and the conventional three-state switching amplifiers.

BRIEF DESCRIPTION OF THE DRAWING

FIG. 1 illustrates typical waveshapes of signals produced in prior art switching amplifiers.

FIG. 2 illustrates typical waveshapes of signals produced at various points in the amplifier of the present invention.

FIG. 3 is a block diagram of one embodiment of the present invention.

FIG. 4 is a schematic diagram of an exemplary circuit utilized to implement the comparators illustrated in FIG. 3.

FIG. 5 is a schematic diagram of an exemplary circuit utilized to implement the switching circuit illustrated in FIG. 3.

DESCRIPTION OF THE PREFERRED EMBODIMENT

The type of pulse width modulation performed by typical two-state and three-state switching amplifiers is illustrated in FIG. 1. FIG. 1(A) shows the manner of operation of a typical two-state switching amplifier whereby an analog signal S to be amplified is compared with a triangular switching signal T. Both the amplitude and the frequency of signal S vary, but the amplitude and frequency of signal T are maintained constant.

A pulse width modulated signal is generated from signals S and T by algebraically summing the instantaneous magnitudes of signals S and T. The pulse width modulated signal is illustrated in FIG. 1(B). It is a bipolar square-wave having a positive magnitude +E when the sum is positive and having a negative magnitude −E when the sum is negative. Generally, this square-wave signal is produced by solid state switches of high current carrying capacity and is used to drive a load through a low pass filter which effects production of a load current having the same waveshape as that of signal S, but a much greater amplitude. The difference between the durations of the positive and negative pulses forming each cycle of the square-wave determines the magnitude of the resultant load current, and the pulse of longer duration (dominant pulse) determines the load current polarity.

The linearity of the amplifier is high over the entire range of analog signal magnitudes because the duration of the dominant pulse in each cycle of the square-wave is substantial in comparison to the duration of the triangle wave period and is not significantly affected by deviations in the triangle wave frequency. However, while the amplifier has high linearity, its output is characterized by undesirably high spectral line content at the switching frequency. This results from the fact that switching occurs between full positive and full negative voltage values, which effectively doubles the switched voltage magnitude. The effect of this high spectral line content becomes most severe when the input (and thus the output) signal magnitudes approach zero, for here the 50% duty cycle is approached, at which the fundamental frequency term generated in the switching operation is a maximum.

FIG. 1(C) shows the manner of operation of a typical three-state amplifier whereby an analog signal S to be amplified is split into its positive and negative components. Each component is compared with a triangular modulation signal T of constant amplitude and frequency. As a result of this comparison an output signal comprising a series of positive and negative pulses, illustrated in FIG. 1(D), is produced. Whenever the magnitude of signal S exceeds that of signal T, a pulse of magnitude E having the polarity of signal S is produced. At all other times, no output signal is produced. The output signal is applied to a load through a low pass filter which effects production of a high amplitude load current having the same waveshape as that of signal S. The duration and polarity of the pulse occurring during each period of signal T determines the magnitude and polarity of the resultant load current.

The spurious output of this amplifier is much lower than the two-state amplifier because switching between full positive and full negative voltage values never occurs and the duration of the pulses approaches zero as the magnitude of the input signal S approaches zero. However, the short-duration pulses produced when the magnitude of signal S is small cause non-linear operation of the three-state amplifier. This is because the durations of these pulses are of the same order of magnitude as the storage times of the amplifier switching transistors used. Inasmuch as storage time varies as a function of temperature, collector current and ON time, the duration of short pulses are determined by these factors, as well as the input signal magnitude, and substantial errors in the duration of these short pulses ordinarily occur.

FIG. 2 illustrates the manner in which the amplifier of the present invention pulse-width modulates an analog input signal S and produces the output signal shown in FIG. 2(F) which, when appropriately filtered, yields an amplified replica of the analog input signal. The signals shown are produced by various elements of the amplifier which is illustrated in one form thereof in FIG. 3.

The amplifier comprises a signal splitter 10, two level shifters 20 and 30, two comparators 40 and 50, a triangle generator 60, a switching circuit 70, and a demodulator 80. The signal splitter 10, which typically comprises two half-wave rectifiers, receives the analog signal to be amplified and splits it into the positive and negative pulse components. These components are provided at outputs of the signal splitter in the form of positive and negative signals representative of the positive and negative portions of the analog signal. The positive signal is received by level shifter 20 which produces a positive replica signal having the same waveshape as the positive signal, but which is shifted negatively by V− volts such that the positive replica signal varies above and below the ground level. The positive replica signal is designated S+ in FIG. 2(B). Similarly, the negative signal is received by level shifter 30 which produces a negative replica signal having the same waveshape as the negative signal, but which is shifted by V+ volts such that the negative replica signal varies above and below the ground level. The negative replica signal is designated S− in FIG. 2(D).

The level shifters utilized in this embodiment are standard summing amplifier circuits which continuously sum the positive and negative signals with constant voltage levels V− and V+, respectively, to produce the replica signals. Preferably, the magnitudes of these voltage levels are chosen so that the positive and negative excursions (with respect to ground) of the replica signals are approximately equal in magnitude during normal operation of the amplifier. It is to be noted that although the voltage levels V− and V+ have been chosen to cause variation of the replica signals about the ground reference level, any convenient reference level may be used.

The positive and negative replica signals are applied to the comparators 40 and 50 which compare these signals to a triangular switching signal T produced by the triangle generator 60. In turn, the comparators produce logical control signals governing the operation of the switching circuit. The triangle generator is a conventional fixed frequency oscillator circuit and the triangular signal produced is illustrated in FIGS. 2(B) and 2(D) as having a constant amplitude and alternating at a constant rate above and below the reference level. Although other linear waveshapes having symmetric positive and negative portions (such as a sawtooth wave) may be used, the isosceles triangle waveshape illustrated produces the minimum distortion in the amplitude-to-pulse-width conversion accomplished by pulse width modulation. In order to maximize the linear range of the amplifier, the amplitude of the triangular switching signal should be just slightly greater than the maximum amplitude replica signal produced during normal operation of the amplifier. If a different reference level than ground is chosen for the replica signals, it should also be utilized as the reference level about which the triangular switching signal varies.

A circuit which may be utilized to implement each of the comparators is illustrated in FIG. 4 as comprising input terminals 40-1/50-1 and 40-2/50-2, resistors R1 and R2, differential amplifier A1, inverter I1 and output terminal 40-3/50-3. The dual designation of each terminal represents the respective terminal of each of the two comparators.

The resistors are effectively connected in series between input terminals 40-1/50-1 and 40-2/50-2 with a junction point between the resistors connected to the inverting input of the amplifier. The non-inverting input of the amplifier is connected to ground. The resistances of resistors R1 and R2 are identical, so the voltage at the junction point between the resistors is one-half the sum of the voltages applied to terminals 40-1/50-1 and 40-2/50-2. Whenever the voltage at the junction point is negative, the amplifier produces a positive output voltage and the inverter produces a logical ZERO signal at terminal 40-3/50-3. Whenever the voltage at the junction point is positive, the amplifier produces a negative voltage at its output and the inverter produces a logical ONE signal at terminal 40-3/50-3. Thus, each comparator sums the magnitudes of the replica signal and the triangular switching signal applied to terminals 40-1/50-1 and 40-2/50-2, respectively, and produces a logical ONE signal at terminal 40-3/50-3 when the sum is positive and produces a logical ZERO signal when the sum is negative.

The logical signals produced by comparators 40 and 50 are illustrated in FIGS. 2(C) and 2(E), respectively. The switching circuit 70 receives these logical signals from the comparators and produces high energy output pulses at the rate of two per cycle of the switching signal. These pulses form a pulse width modulated waveform, as shown in FIG. 2(F), which is utilized by the demodulator 80 to reproduce the original analog signal in amplified form.

Switching circuit 70 is illustrated in one form thereof in FIG. 5. Input and output terminals have been designated 70-1, 70-2 and 70-3, 70-4, respectively, in FIGS. 3 and 5. The switching function is carried out by four transistor switches Q1, Q2, Q3 and Q4 connected in a full-wave bridge configuration between ground and a d.c. power source providing a voltage of magnitude $V_{DC}$.

The logical signals produced by comparator 50 are received at terminal 70-1 and applied to the base-emitter junction of transistor Q1 through a pulse transformer T1. These same signals are applied to an inverter I2 and the inverted signals are applied to the base-emitter junction of transistor Q2 through a pulse transformer T2.

The logical signals produced by comparator 40 are received at terminal 70-2 and applied to an inverter I4. The inverted signal produced thereby is applied to the base-emitter junction of transistor Q4 through a pulse transformer T4. The signal produced by inverter I4 is also applied to an inverter I3 which reproduces the logical signal received at terminal 70-2 and applies it to the base-emitter junction of transistor Q3 through a pulse transformer T3.

The switching bridge produces bipolar output pulses at terminals 70-3, 70-4 in response to the logical signals received at terminals 70-1, 70-2. The output pulses produced in response to the logical signals illustrated in FIGS. 2(C) and 2(E) are shown in FIG. 2(F).

Each positive pulse, representative of a logical ONE produced by comparator 50, is applied to the primary winding of transformer T1 causing the secondary winding to produce a pulse of identical duration and forward bias transistor switch Q1 into its ON or conducting state. Each positive pulse representative of a logical ONE produced by comparator 40 is reproduced by inverter I3 and applied to the primary winding of transformer T3 causing the secondary winding to produce a pulse of identical duration and forward bias transistor switch Q3 into its ON state.

Each logical ZERO signal produced by comparator 50 is inverted by inverter I2 which produces a positive pulse representative of a logical ONE. The pulse is applied to the primary winding of transformer T2 causing the secondary winding to produce a pulse of the same duration as the logical ZERO signal and forward bias transistor switch Q2 into its ON state during the existence of the pulse. Similarly, each logical ZERO signal produced by comparator 40 is inverted by inverter I4 and a positive pulse of the same duration is produced by the secondary winding of transformer T4, forward biasing transistor switch Q4 into its ON state during the existence of the pulse.

Whenever the two comparators are concurrently producing logical ONE signals, output terminal 70-3 is connected to the positive voltage $V_{DC}$ through ON switch Q1 and output terminal 70-4 is connected to the ground voltage level through ON switch Q3 causing a high-energy positive pulse to be produced across the output terminals.

Whenever the two comparators are concurrently producing logical ZERO signals, output terminal 70-3 is connected to the ground voltage level through ON switch Q2 and output terminal 70-4 is connected to the positive voltage $V_{DC}$ through ON switch Q4 causing a high-energy negative pulse to be produced across the output terminals.

No signal is produced across the output terminals when the comparators are producing unlike logical signals. If comparator 50 is producing a logical ZERO signal while comparator 40 is producing a logical ONE signal, switches Q2 and Q3 will be ON and the voltage levels at both output terminals will be the same (ground). Conversely, if comparator 50 is producing a logical ONE signal while comparator 40 is producing a logical ZERO signal, switches Q1 and Q4 will be ON and the voltage levels at both output terminals will be the same ($V_{DC}$).

The output pulses produced by the switching bridge are applied to demodulator 80, which produces an amplified replica of the analog signal at output terminals 80-1 and 80-2. Typically, the demodulator comprises a low-pass filter which only slightly attenuates the low fundamental frequency components of the widest pulses, but highly attenuates the relatively high fundamental frequency components of the shortest pulses. The composite of the frequency components passed by the filter is the analog signal.

The amount of power delivered by the amplifier to a load connected across terminals 80-1 and 80-2, for a given input, is determined by the magnitude of the voltage $V_{DC}$ provided by the power source and by the combined impedance of the demodulator and the load. If this impedance includes an inductive component it is advantageous to include diodes D1, D2, D3 and D4 in the switching bridge. These diodes prevent development of high inverse voltages across the collector-emitter junctions of the transistors Q1–Q4 by the inductive component when the transistors switch from the ON to the OFF state.

The output pulses produced by the switching circuit 70 have the advantageous characteristics of pulses produced by both types of prior art amplifiers previously described, as can be ascertained by comparing FIGS. 1(B), 1(D) and 2(F).

As in the case of the prior art two-state switching amplifier, the output pulses are cyclically produced in pairs, each pair comprising one positive pulse and one negative pulse. The duration and the polarity of the dominant pulse in each pair represents the magnitude and the polarity, respectively, of the analog signal during the triangular switching signal cycle in which the pulse pair is produced. Linearity is high over the entire magnitude range of analog signals to be amplified, because the duration of the dominant pulse in each cycle is substantial in comparison to the period of the triangle signal. When the magnitude of the analog signal is at its peak, the maximum duration dominant pulse is produced. As the magnitude of the analog signal decreases toward zero, the duration of the dominant pulse decreases to a predetermined minimum pulse width W, where the durations of the pulses in a pair become equal. The duration of this minimum pulse width W is chosen so that it is much longer than the maximum deviation in the uncontrollable storage times of the transistor switches, but much shorter than the period of the triangle signal. The duration of W is determined primarily by the extent of level shifting effected by shifters 20 and 30 and can be adjusted by changing the voltages V+ and V−. As an example, for a signal S+ having an amplitude of 10 volts and a frequency of 6 KHZ; and a signal T having a peak-to-peak magnitude of 12 volts and a frequency of 31 KHZ, level shifting voltages of V+ and V− of approximately 5 volts will effect production of a minimum pulse width W of approximately 1 microsecond.

As in the case of the prior art three-state switching amplifier, the output pulses are produced during only a portion of each period of the triangle signal. When the magnitude of the analog signal is at its peak the combined durations of the pair of pulses produced approaches the period of the triangle signal. As the magnitude of the analog signal decreases to zero the combined durations of the pair of pulses produced decreases to 2W. The total duration of the pulses produced during any interval of time is only slightly longer than would be produced by the prior art three-state switching amplifier during the same interval with the same analog signal applied to its input. As a consequence, the spurious signal content of the pulses produced by an amplifier operating in accordance with the present invention can be maintained comparable to that of a conventional three-state amplifier.

Although a particular embodiment of the present invention has been disclosed, it is to be understood that this embodiment is illustrative of only one way in which the invention can be implemented and it is not intended to limit the scope of the invention. For example, the switching circuit can be implemented by a push-pull transistor circuit or some other switching configuration rather than by the switching bridge disclosed. The scope of the invention is to be ascertained by referring to the appended claims.

I claim:

1. A pulse width modulated switching amplifier for amplifying an analog signal comprising:
   (a) means for receiving the analog signal and producing positive and negative signals representative of positive and negative excursions of the analog signal, respectively;
   (b) a first level shifter for receiving the positive signal and producing a first replica signal having the same waveshape as the positive signal but varying above and below a predetermined reference level;
   (c) a second level shifter for receiving the negative signal and producing a second replica signal having the same waveshape as the negative signal but varying above and below the predetermined reference level;
   (d) a signal generator for producing a linear switching signal having a constant amplitude and alternating at a constant rate above and below the predetermined reference level;
   (e) a first comparator for summing the magnitudes of the first replica signal and the switching signal and producing a first type of control signal when the sum is positive and producing a second type of control signal when the sum is negative;
   (f) a second comparator for summing the magnitudes of the second replica signal and the switching signal and producing the first type of control signal when the sum is positive and producing the second type of control signal when the sum is negative;
   (g) a switching circuit adapted to receive said control signals from the comparators and effective to produce an output pulse of one polarity when both comparators are producing the first type of control signal, an output pulse of the opposite polarity when both comparators are producing the second type of control signal and no output when the comparators are producing unlike control signals; and
   (h) a demodulator for receiving the output pulses and producing an amplified replica of the analog signal.

2. A pulse width modulated switching amplifier as in claim 1, wherein said signal generator effects production of a switching signal having a triangular waveshape.

3. A pulse width modulated switching amplifier as in claim 1, wherein said switching circuit comprises transistor switches connected in a bridge configuration.

4. A pulse width modulated switching amplifier as in claim 1, wherein said demodulator comprises a low pass filter.

5. A pulse width modulated switching amplifier for amplifying an analog signal comprising:
   (a) a signal splitter for receiving the analog signal and producing positive and negative signals representative of positive and negative excursions of the analog signal, respectively;
   (b) a first level shifter for receiving the positive signal and producing a positive replica signal having the same waveshape as the positive signal but varying above and below a predetermined reference level;
   (c) a second level shifter for receiving the negative signal and producing a negative replica signal having the same waveshape as the negative signal but varying above and below the predetermined reference level;
   (d) a signal generator for producing a linear switching signal having portions symmetrically disposed above and below the predetermined reference level, alternating at a constant rate and having a constant amplitude;
   (e) a first comparator for summing the magnitudes of the positive replica signal and the switching signal and producing a logical ONE control signal when the sum is positive and producing a logical ZERO control signal when the sum is negative;

(f) a second comparator for summing the magnitudes of the negative replica signal and the switching signal and producing a logical ONE control signal when the sum is positive and producing a logical ZERO control signal when the sum is negative;

(g) a switching circuit adapted to receive said logical control signals from the comparators and effective to produce an output pulse of one polarity when both comparators are producing logical ONE signals, an output pulse of the opposite polarity when both comparators are producing logical ZERO signals and no output when the comparators are producing unlike logical signals; and (h) a demodulator for receiving the output pulses and producing an amplified replica of the analog signal.

6. A pulse width modulated switching amplifier for amplifying a bipolar analog signal comprising:

(a) a signal splitter for receiving the bipolar analog signal and splitting it into its positive and negative components;

(b) a first level shifter for receiving the positive component and producing a positive replica signal having the same waveshape as the positive component but varying above and below a predetermined reference level;

(c) a second level shifter for receiving the negative component and producing a negative replica signal having the same waveshape as the negative component but varying above and below the predetermined reference level;

(d) a signal generator for producing a triangular switching signal having a constant amplitude and alternating at a constant rate above and below the predetermined reference level;

(e) a first comparator for summing the magnitudes of the positive replica signal and the triangular switching signal and producing a logical ONE control signal when the sum is positive and producing a logical ZERO control signal when the sum is negative;

(f) a second comparator for summing the magnitudes of the negative replica signal and the triangular switching signal and producing a logical ONE control signal when the sum is positive and producing a logical ZERO control signal when the sum is negative;

(g) a switching bridge circuit adapted to receive said logical control signals from the comparators and effective to produce an output pulse of one polarity when both comparators are producing logical ONE signals, an output pulse of the opposite polarity when both comparators are producing logical ZERO signals and no output when the comparators are producing unlike logical signals; and (h) a low pass filter for receiving the output pulses and producing an amplified replica of the analog signal.

* * * * *